(12) United States Patent
Khlat (10) Patent No.: US 11,558,016 B2
(45) Date of Patent: Jan. 17, 2023

(54) FAST-SWITCHING AVERAGE POWER TRACKING POWER MANAGEMENT INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 54 days.

(21) Appl. No.: 17/182,539

(22) Filed: Feb. 23, 2021

(65) Prior Publication Data

US 2021/0288615 A1   Sep. 16, 2021

Related U.S. Application Data

(60) Provisional application No. 62/988,502, filed on Mar. 12, 2020.

(51) Int. Cl.
   *H03F 1/30*   (2006.01)
   *H03F 1/02*   (2006.01)
   (Continued)

(52) U.S. Cl.
   CPC .............. *H03F 1/0233* (2013.01); *H03F 1/56* (2013.01); *H03F 3/195* (2013.01); *H03F 3/245* (2013.01);
   (Continued)

(58) Field of Classification Search
   CPC ................ H03F 1/30; H03F 3/20; H03G 3/30
   (Continued)

(56) References Cited

U.S. PATENT DOCUMENTS 8,159,309 B1  4/2012  Khlat et al.
8,718,188 B2  5/2014  Balteanu et al.
(Continued)

FOREIGN PATENT DOCUMENTS

DE  102019218816 A1  6/2020
WO  2018187245 A1  10/2018
WO  2021016350 A1  1/2021

OTHER PUBLICATIONS

Non-Final Office Action for U.S. Appl. No. 17/217,654, dated Jul. 1, 2022, 9 pages.
(Continued)

*Primary Examiner* — Henry Choe
(74) *Attorney, Agent, or Firm* — Withrow & Terranova, P.L.L.C.

(57) ABSTRACT

A fast-switching average power tracking (APT) power management integrated circuit (PMIC) is provided. The fast-switching APT PMIC includes a voltage amplifier(s) and an offset capacitor(s) having a small capacitance (e.g., between 10 nF and 200 nF). The voltage amplifier(s) is configured to generate an initial APT voltage(s) based on an APT target voltage(s) and the offset capacitor(s) is configured to raise the initial APT voltage(s) by an offset voltage(s) to generate an APT voltage(s). In embodiments disclosed herein, the offset voltage(s) is modulated based on the APT target voltage(s). Given the small capacitance of the offset capacitor(s), it is possible to adapt the offset voltage(s) fast enough to thereby change the APT voltage(s) within a predetermined temporal limit (e.g., 0.5 μs). As a result, the fast-switch APT PMIC can enable a power amplifier(s) to support dynamic power control with improved linearity and efficiency.

20 Claims, 4 Drawing Sheets

(51) Int. Cl.
*H03F 3/24* (2006.01)
*H03F 1/56* (2006.01)
*H03F 3/195* (2006.01)

(52) U.S. Cl.
CPC .. *H03F 2200/105* (2013.01); *H03F 2200/451* (2013.01)

(58) Field of Classification Search
USPC ......................................... 330/297, 296, 285
See application file for complete search history.

(56) References Cited

U.S. PATENT DOCUMENTS

| | | | |
|---|---|---|---|
| 8,912,769 | B2 | 12/2014 | Lin et al. |
| 9,020,453 | B2 | 4/2015 | Briffa et al. |
| 9,069,365 | B2 | 6/2015 | Brown et al. |
| 9,148,090 | B2 | 9/2015 | Tsuji |
| 9,172,331 | B2 | 10/2015 | Nagasaku et al. |
| 9,231,527 | B2 | 1/2016 | Hur et al. |
| 9,350,299 | B2 | 5/2016 | Tsuji |
| 9,391,567 | B2 | 7/2016 | Kaczman |
| 9,407,476 | B2 | 8/2016 | Lim et al. |
| 9,496,828 | B2 | 11/2016 | Ye |
| 9,614,477 | B1 | 4/2017 | Rozenblit et al. |
| 9,634,560 | B2 | 4/2017 | Ek |
| 10,097,145 | B1 | 10/2018 | Khlat et al. |
| 10,103,926 | B1 | 10/2018 | Khlat |
| 10,142,074 | B2 | 11/2018 | Wang et al. |
| 10,243,524 | B2 | 3/2019 | Or |
| 10,476,437 | B2 * | 11/2019 | Nag ..................... H03F 1/0216 |
| 10,778,094 | B2 | 9/2020 | de Cremoux |
| 10,862,428 | B2 | 12/2020 | Henzler et al. |
| 10,998,859 | B2 | 5/2021 | Khlat |
| 11,018,627 | B2 * | 5/2021 | Khlat ..................... H03F 3/195 |
| 11,018,638 | B2 | 5/2021 | Khlat et al. |
| 11,223,325 | B2 | 1/2022 | Drogi et al. |
| 2003/0099230 | A1 | 5/2003 | Wenk |
| 2004/0179382 | A1 | 9/2004 | Thaker et al. |
| 2013/0141063 | A1 | 6/2013 | Kay et al. |
| 2013/0141068 | A1 | 6/2013 | Kay et al. |
| 2014/0312710 | A1 | 10/2014 | Li |
| 2016/0294587 | A1 | 10/2016 | Jiang et al. |
| 2018/0234011 | A1 | 8/2018 | Muramatsu et al. |
| 2018/0257496 | A1 | 9/2018 | Andoh et al. |
| 2018/0278213 | A1 | 9/2018 | Henzler et al. |
| 2018/0351454 | A1 | 12/2018 | Khesbak et al. |
| 2019/0068234 | A1 | 2/2019 | Khlat et al. |
| 2019/0109566 | A1 | 4/2019 | Folkmann et al. |
| 2019/0181813 | A1 | 6/2019 | Maxim et al. |
| 2019/0222175 | A1 | 7/2019 | Khlat et al. |
| 2019/0288645 | A1 * | 9/2019 | Nag ..................... H03F 3/245 |
| 2019/0334750 | A1 | 10/2019 | Nomiyama et al. |
| 2019/0356285 | A1 | 11/2019 | Khlat et al. |
| 2020/0076297 | A1 | 3/2020 | Nag et al. |
| 2020/0127612 | A1 | 4/2020 | Khlat et al. |
| 2020/0136575 | A1 | 4/2020 | Khlat et al. |
| 2020/0212796 | A1 | 7/2020 | Murphy et al. |
| 2020/0266766 | A1 | 8/2020 | Khlat et al. |
| 2020/0295708 | A1 * | 9/2020 | Khlat ..................... H03F 3/602 |
| 2020/0336105 | A1 | 10/2020 | Khlat |
| 2020/0336111 | A1 | 10/2020 | Khlat |
| 2020/0389132 | A1 | 12/2020 | Khlat et al. |
| 2021/0036604 | A1 | 2/2021 | Khlat et al. |
| 2021/0126599 | A1 | 4/2021 | Khlat et al. |
| 2021/0175798 | A1 | 6/2021 | Liang |
| 2021/0184708 | A1 | 6/2021 | Khlat |
| 2021/0211108 | A1 * | 7/2021 | Khlat ..................... H03F 3/189 |
| 2021/0226585 | A1 * | 7/2021 | Khlat ..................... H03F 3/213 |
| 2021/0257971 | A1 | 8/2021 | Kim et al. |
| 2021/0265953 | A1 | 8/2021 | Khlat |
| 2022/0021302 | A1 | 1/2022 | Khlat et al. |
| 2022/0029614 | A1 | 1/2022 | Khlat |
| 2022/0037982 | A1 | 2/2022 | Khlat et al. |
| 2022/0052655 | A1 | 2/2022 | Khalt |
| 2022/0057820 | A1 | 2/2022 | Khlat et al. |
| 2022/0066487 | A1 | 3/2022 | Khlat |
| 2022/0069788 | A1 | 3/2022 | King et al. |
| 2022/0123744 | A1 | 4/2022 | Khlat |
| 2022/0271714 | A1 * | 8/2022 | Khlat ..................... H03F 3/245 |

OTHER PUBLICATIONS

Non-Final Office Action for U.S. Appl. No. 17/218,904, dated May 25, 2022, 14 pages.
Notice of Allowance for U.S. Appl. No. 17/315,652, dated Jun. 20, 2022, 8 pages.
Mellon, L., "Data Transmission—Parallel vs Serial," Jul. 10, 2017, https//www.quantil.com/content-delivery-insights/content-acceleration/data-transmission/, 4 pages.
Non-Final Office Action for U.S. Appl. No. 17/237,244, dated Sep. 20, 2021, 14 pages.
Non-Final Office Action for U.S. Appl. No. 17/325,482, dated Sep. 30, 2021, 10 pages.
Non-Final Office Action for U.S. Appl. No. 17/315,652, dated Sep. 2, 2021, 7 pages.
Notice of Allowance for U.S. Appl. No. 17/237,244, dated Jan. 27, 2022, 8 pages.
Non-Final Office Action for U.S. Appl. No. 17/325,482, dated Mar. 15, 2022, 10 pages.
Non-Final Office Action for U.S. Appl. No. 17/315,652, dated Feb. 14, 2022, 12 pages.
International Search Report and Written Opinion for International Patent Application No. PCT/US2021/061721, dated Mar. 14, 2022, 13 pages.
International Preliminary Report on Patentability for International Patent Application No. PCT/US2021/044596, dated Sep. 1, 2022, 19 pages.
Notice of Allowance for U.S. Appl. No. 17/217,654, dated Oct. 12, 2022, 8 pages.
Notice of Allowance for U.S. Appl. No. 17/218,904, dated Aug. 26, 2022, 9 pages.
Final Office Action for U.S. Appl. No. 17/325,482, dated Aug. 16, 2022, 12 pages.
Advisory Action for U.S. Appl. No. 17/325,482, dated Oct. 14, 2022, 3 pages.
Non-Final Office Action for U.S. Appl. No. 17/408,899, dated Aug. 29, 2022, 13 pages.
Written Opinion for International Patent Application No. PCT/US2021/061721, dated Sep. 9, 2022, 7 pages.
Notice of Allowance for U.S. Appl. No. 17/325,482, dated Nov. 30, 2022, 8 pages.

* cited by examiner

FAST-SWITCHING AVERAGE POWER TRACKING POWER MANAGEMENT INTEGRATED CIRCUIT

RELATED APPLICATIONS

This application claims the benefit of provisional patent application Ser. No. 62/988,502, filed Mar. 12, 2020, the disclosure of which is hereby incorporated herein by reference in its entirety.

FIELD OF THE DISCLOSURE

The technology of the disclosure relates generally to an average power tracking (APT) power management integrated circuit (PMIC).

BACKGROUND

Fifth-generation (5G) new radio (NR) (5G-NR) has been widely regarded as the next generation of wireless communication technology beyond the current third-generation (3G) and fourth-generation (4G) technologies. In this regard, a wireless communication device capable of supporting the 5G-NR wireless communication technology is expected to achieve higher data rate, improved coverage range, enhanced signaling efficiency, and reduced latency across a wide range of radio frequency (RF) bands, which include a low-band (below 1 GHz), a mid-band (1 GHz to 6 GHz), and a high-band (above 24 GHz). Moreover, the wireless communication device may still support the legacy 3G and 4G technologies for backward compatibility.

In addition, the wireless communication device is also required to support local area networking technologies, such as Wi-Fi, in both 2.4 GHz and 5 GHz bands. The latest 802.11ax standard has introduced a dynamic power control feature to allow the wireless communication device to transmit a Wi-Fi signal with a maximum power ranging from −10 dBm to 23 dBm. Accordingly, a Wi-Fi power amplifier(s) in the wireless communication device must be able to adapt a power level of the Wi-Fi signal on a per-frame basis. As a result, a power management integrated circuit (PMIC) must be able to adapt an average power tracking (APT) voltage supplied to the Wi-Fi power amplifier(s) within Wi-Fi inter-frame spacing (IFS) to help maintain linearity and efficiency of the Wi-Fi power amplifier(s).

Notably, the Wi-Fi IFS may only last sixteen microseconds (16 µs). Depending on specific configurations of the Wi-Fi system, such as bandwidth mode, trigger frame format, modulation and coding scheme (MCS), and delays associated with Wi-Fi physical layer (PHY) and communication buses, the actual temporal limit for the PMIC to adapt the APT voltage(s) may be as short as one-half of a microsecond (0.5 µs). In this regard, it is desirable for the PMIC to adapt the APT voltage(s) from one level to another within a predetermined temporal limit (e.g., 0.5 µs).

SUMMARY

Embodiments of the disclosure relate to a fast-switching average power tracking (APT) power management integrated circuit (PMIC). The fast-switching APT PMIC includes a voltage amplifier(s) and an offset capacitor(s) having a small capacitance (e.g., between 10 nF and 200 nF). The voltage amplifier(s) is configured to generate an initial APT voltage(s) based on an APT target voltage(s) and the offset capacitor(s) is configured to raise the initial APT voltage(s) by an offset voltage(s) to generate an APT voltage(s). In embodiments disclosed herein, the offset voltage(s) is modulated based on the APT target voltage(s). Given the small capacitance of the offset capacitor(s), it is possible to adapt the offset voltage(s) fast enough to thereby change the APT voltage(s) within a predetermined temporal limit (e.g., 0.5 µs). As a result, the fast-switch APT PMIC can enable a power amplifier(s) to support dynamic power control with improved linearity and efficiency.

In one aspect, a fast-switching APT PMIC is provided. The fast-switching APT PMIC includes a first voltage amplifier configured to generate a first initial APT voltage based on a first APT target voltage. The fast-switching APT PMIC also includes a first offset capacitor configured to raise the first initial APT voltage by a first offset voltage to generate a first APT voltage at a first voltage output. The fast-switching APT PMIC also includes a second voltage amplifier configured to generate a second initial APT voltage based on a second APT target voltage. The fast-switching APT PMIC also includes a second offset capacitor configured to raise the second initial APT voltage by a second offset voltage to generate a second APT voltage at a second voltage output. The fast-switching APT PMIC also includes a control circuit. The control circuit is configured to determine at least one offset target voltage based on at least one of the first APT target voltage and the second APT target voltage. The control circuit is also configured to adjust at least one of the first offset voltage and the second offset voltage based on the at least one offset target voltage to thereby cause at least one of the first APT voltage and the second APT voltage to become substantially equal to the at least one of the first APT target voltage and the second APT target voltage within a predetermined temporal limit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a fast-switching average power tracking (APT) power management integrated circuit (PMIC). The fast-switching APT PMIC includes a voltage amplifier(s) and an offset capacitor(s) having a small capacitance (e.g., between 10 nF and 200 nF). The voltage amplifier(s) is configured to generate an initial APT voltage(s) based on an APT target voltage(s) and the offset capacitor(s) is configured to raise the initial APT voltage(s) by an offset voltage(s) to generate an APT voltage(s). In embodiments disclosed herein, the offset voltage(s) is modulated based on the APT target voltage(s). Given the small capacitance of the offset capacitor(s), it is possible to adapt the offset voltage(s) fast enough to thereby change the APT voltage(s) within a predetermined temporal limit (e.g., 0.5 μs). As a result, the fast-switch APT PMIC can enable a power amplifier(s) to support dynamic power control with improved linearity and efficiency.

Figure 1:
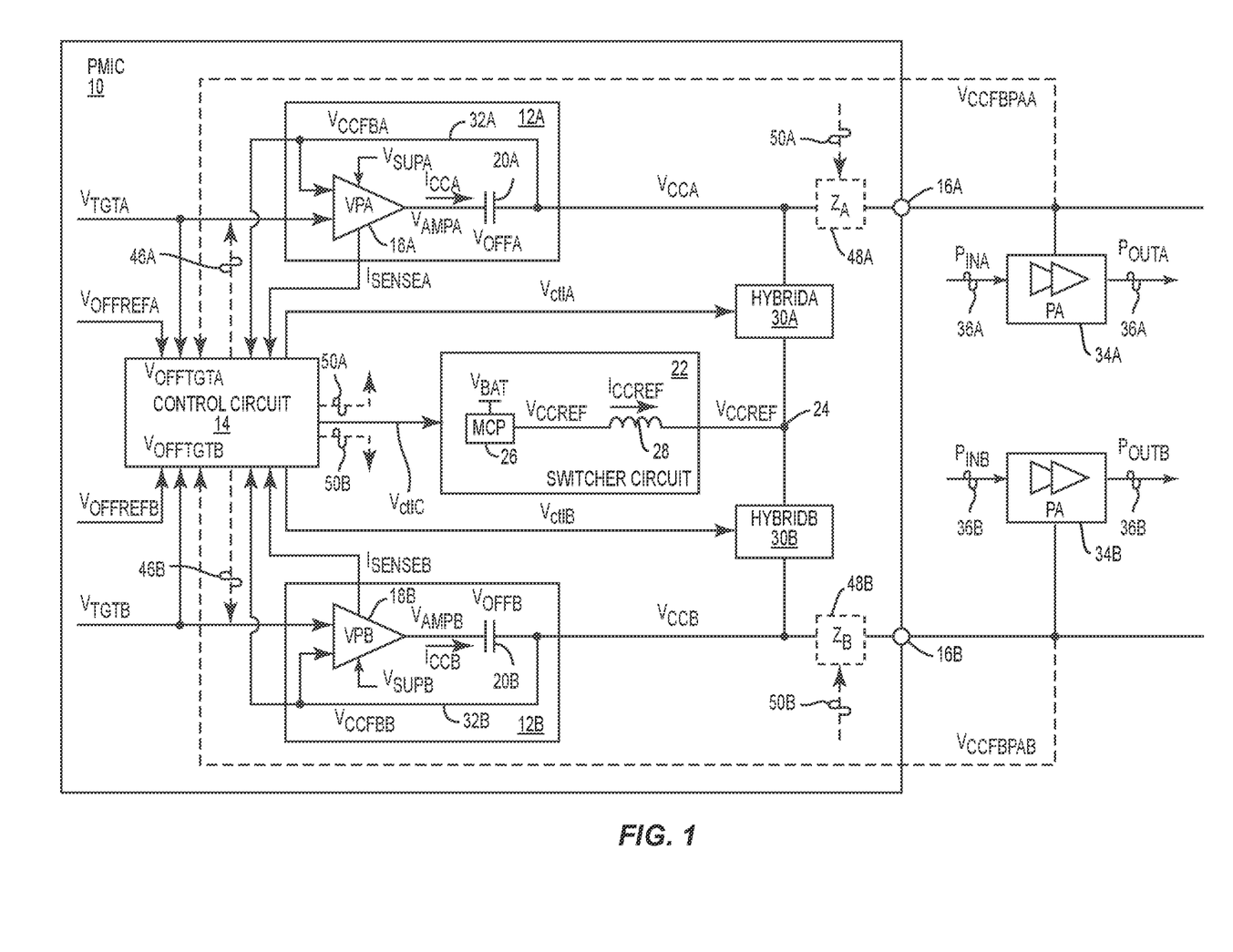
FIG. 1 is a schematic diagram of an exemplary fast-switching average power tracking (APT) power management integrated circuit (PMIC) configured according to an embodiment of the present disclosure to adapt one or more APT voltages from one level to another within a predetermined temporal limit.

In this regard, FIG. 1 is a schematic diagram of an exemplary fast-switching APT PMIC 10 configured according to an embodiment of the present disclosure to adapt one or more of a first APT voltage $V_{CCA}$ and a second APT voltage $V_{CCB}$ from one level to another within a predetermined temporal limit. The fast-switching APT PMIC 10 includes a first voltage circuit 12A, a second voltage circuit 12B, and a control circuit 14, which can be a field-programmable gate array (FPGA), as an example. The first voltage circuit 12A is configured to generate the first APT voltage $V_{CCA}$ at a first voltage output 16A based on a first APT target voltage $V_{TGTA}$. The second voltage circuit 12B is configured to generate the second APT voltage $V_{CCB}$ at a second voltage output 16B based on a second APT target voltage $V_{TGTB}$.

The first voltage circuit 12A includes a first voltage amplifier 18A and a first offset capacitor 20A. The first voltage amplifier 18A is configured to generate a first initial APT voltage $V_{AMPA}$, which is typically lower than the first APT target voltage $V_{TGTA}$, based on the first APT target voltage $V_{TGTA}$ and a first supply voltage $V_{SUPA}$. The first offset capacitor 20A, which is coupled between the first voltage amplifier 18A and the first voltage output 16A, is configured to raise the first initial APT voltage $V_{AMPA}$ by a first offset voltage $V_{OFFA}$ to generate the first APT voltage $V_{CCA}$ at the first voltage output 16A ($V_{CCA}=V_{AMPA}+V_{OFFA}\approx V_{TGTA}$).

The second voltage circuit 12B includes a second voltage amplifier 18AB and a second offset capacitor 20B. The second voltage amplifier 18B is configured to generate a second initial APT voltage $V_{AMPB}$, which is typically lower than the second APT target voltage $V_{TGTB}$, based on the second APT target voltage $V_{TGTB}$ and a second supply voltage $V_{SUPB}$. The second offset capacitor 20B, which is coupled between the second voltage amplifier 18B and the second voltage output 16B, is configured to raise the second initial APT voltage $V_{AMPB}$ by a second offset voltage $V_{OFFB}$ to generate the second APT voltage $V_{CCB}$ at the second voltage output 16B ($V_{CCB}=V_{AMPB}+V_{OFFB}\approx V_{TGTB}$).

The control circuit 14 is configured to determine a first offset target voltage $V_{OFFTGTA}$ and/or a second offset target voltage $V_{OFFTGTB}$ based on the first APT target voltage $V_{TGTA}$ and/or the second APT target voltage $V_{TGTB}$. Accordingly, the control circuit 14 can adjust (increase or decrease) the first offset voltage $V_{OFFA}$ based on the first offset target voltage $V_{OFFTGTA}$ and/or adjust the second first offset voltage $V_{OFFB}$ based on the second offset target voltage $V_{OFFTGTB}$. Given the small capacitance of the first offset capacitor 20A and the second offset capacitor 20B, it is possible to quickly adjust the first offset voltage $V_{OFFA}$ across the first offset capacitor 20A and/or the second offset voltage $V_{OFFB}$ across the second offset capacitor 20B to thereby cause the first APT voltage $V_{CCA}$ and/or the second APT voltage $V_{CCB}$ to become substantially equal to the first APT target voltage $V_{TGTA}$ (e.g., $V_{CCA}=V_{TGTA}\pm 0.1$ V) and/or the second APT target voltage $V_{TGTB}$ (e.g., $V_{CCB}=V_{TGTB}\pm 0.1$ V) within the predetermined temporal limit. As a result, it is possible to employ the fast-switching APT PMIC 10 in a wireless device (e.g., a smartphone) to support dynamic power control, as required by such Wi-Fi standards as 802.11ax.

Figure 2:
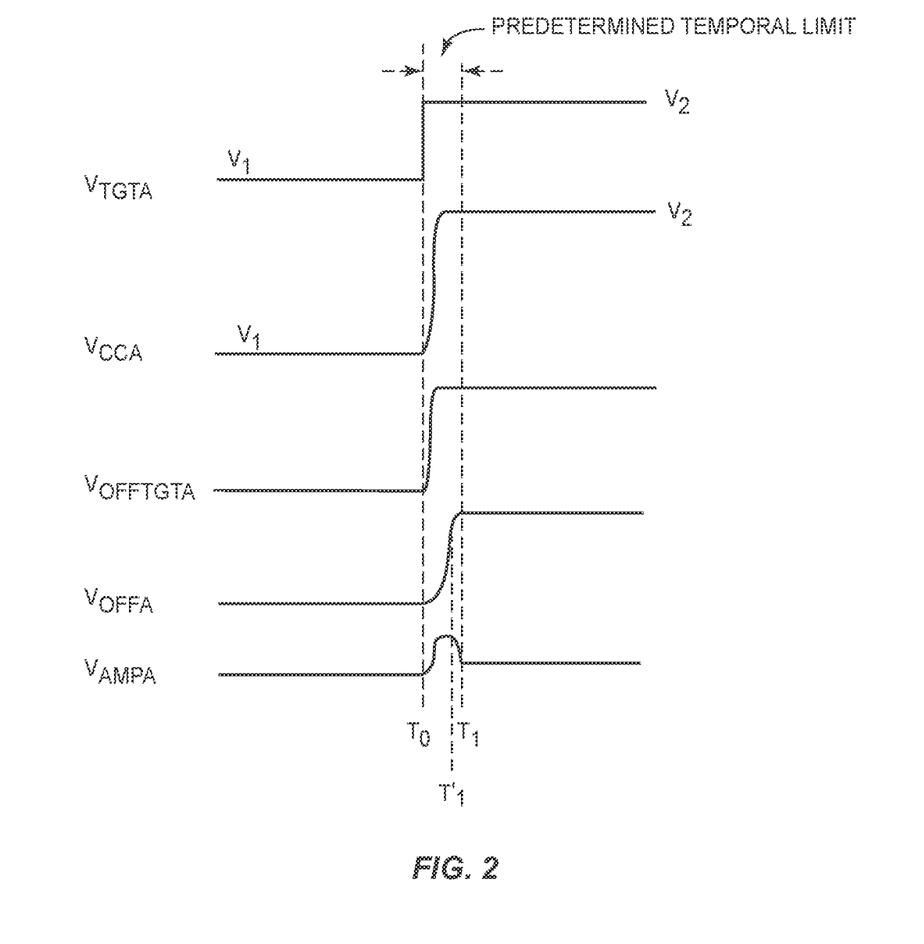
FIG. 2 is a graphic diagram providing an exemplary illustration as to how the fast-switching APT PMIC in FIG. 1 can be configured to quickly adapt the APT voltages within the predetermined temporal limit.

In a non-limiting example, FIG. 2 is a graphic diagram providing an exemplary illustration as to how the fast-switching APT PMIC 10 of FIG. 1 can be configured to quickly adapt the first APT voltage $V_{CCA}$ within the predetermined temporal limit. As shown in FIG. 2, the fast-switching APT PMIC 10 is required to increase the first APT voltage $V_{CCA}$ from a first level $V_1$ to a second level $V_2$ within the predetermined temporal limit, as defined by time $T_0$ and $T_1$.

At time $T_0$, the control circuit 14 receives the first APT target voltage $V_{TGTA}$ that indicates a rise of the first APT voltage $V_{CCA}$ from the first voltage level $V_1$ (e.g., 1 V) to the second voltage level $V_2$ (e.g., 3.5 V) by time $T_1$. Accordingly, the control circuit 14 generates the first offset target voltage $V_{OFFTGTA}$ to thereby cause the first offset voltage $V_{OFFA}$ to increase at or immediately after time $T_0$. Concurrent to increasing the first offset voltage $V_{OFFA}$, the first voltage amplifier 18A also increases the first initial APT voltage $V_{AMPA}$. As a result, it is possible to ramp up the first APT voltage $V_{CCA}$ by time $T_1$.

Notably, at time $T_0$, the first voltage amplifier 18A may have to contribute more to the first APT voltage $V_{CCA}$ by ramping up the first initial APT voltage $V_{AMPA}$, while the first offset capacitor 20A is being charged. As the first offset capacitor 20A is charged up, the first offset voltage $V_{OFFA}$ increases accordingly. For example, when the first offset voltage $V_{OFFA}$ increases to a sufficient level at time $T'_1$ ($T'_1<T_1$), the first voltage amplifier 18A may start reducing the first initial APT voltage $V_{AMPA}$. In this regard, the first initial APT voltage $V_{AMPA}$ is somewhat capped at a certain level. As a result, it is possible to maintain the first supply voltage $V_{SUPA}$ at a lower level to help improve efficiency of the first voltage amplifier 18A.

With reference back to FIG. 1, the fast-switching APT PMIC 10 includes a switcher circuit 22 coupled between the control circuit 14 and a reference output 24. The switcher circuit 22 includes a multi-level charge pump (MCP) 26 and a power inductor 28, which is coupled between the MCP 26 and the reference output 24. The MCP 26 is configured to generate a low-frequency voltage $V_{CCREF}$ (e.g., a constant voltage) at multiple voltage levels based on a battery voltage $V_{BAT}$. For example, the MCP 26 can be configured to operate in a buck-mode to generate the low-frequency voltage $V_{CCREF}$ lower than or equal to the battery voltage $V_{BAT}$ or in a boost-mode to generate the low-frequency voltage $V_{CCREF}$ higher than the battery voltage $V_{BAT}$. The low-frequency voltage $V_{CCREF}$ can cause the power inductor 28 to induce a low-frequency current $I_{CCREF}$ (e.g., a constant current) at the reference output 24. In this regard, it is possible to adjust the low-frequency current $I_{CCREF}$ at the reference output 24 by adjusting the low-frequency voltage $V_{CCREF}$.

The fast-switching APT PMIC 10 includes a first hybrid circuit 30A, which is coupled to the reference output 24, the first offset capacitor 20A, and the first voltage output 16A. The first hybrid circuit 30A may be configured to operate in a current regulator mode to regulate the low-frequency current $I_{CCREF}$ that flows from the reference output 24 toward the first voltage output 16A and the first offset capacitor 20A. Alternatively, the first hybrid circuit 30A may also be configured to operate in a switch mode to pass the low-frequency current $I_{CCREF}$ directly from the reference output 24 to the first voltage output 16A and the first offset capacitor 20A.

The fast-switching APT PMIC 10 also includes a second hybrid circuit 30B, which is coupled to the reference output 24, the second offset capacitor 20B, and the second voltage output 16B. Like the first hybrid circuit 30A, the second hybrid circuit 30B may be configured to operate in the current regulator mode to regulate the low-frequency current $I_{CCREF}$ that flows from the reference output 24 toward the second voltage output 16B and the second offset capacitor 20B. Alternatively, the second hybrid circuit 30B may also be configured to operate in the switch mode to pass the low-frequency current $I_{CCREF}$ directly from the reference output 24 to the second voltage output 16B and the second offset capacitor 20B.

The first voltage output 16A may be coupled to a first power amplifier 34A configured to amplify a first radio frequency (RF) signal 36A from a time-variant input power $P_{ING}$ to a time-variant output power $P_{OUTA}$ based on the first APT voltage $V_{CCA}$. In a non-limiting example, the first RF signal 36A can be a Wi-Fi communication signal to be transmitted in the 2.4 GHz band. In this regard, the first power amplifier 34A may be required to support dynamic power control and thus requiring the fast-switching APT PMIC 10 to quickly adapt the first APT voltage $V_{CCA}$ in accordance with the time-variant output power $P_{OUTA}$, as reflected by the first APT target voltage $V_{TGTA}$.

Similarly, the second voltage output 16B may be coupled to a second power amplifier 34B configured to amplify a second RF signal 36B from a second time-variant input power $P_{INB}$ to a second time-variant output power $P_{OUTB}$ based on the second APT voltage $V_{CCB}$. In a non-limiting example, the second RF signal 36B can be a second Wi-Fi communication signal to be transmitted in the 5 GHz band. In this regard, the second power amplifier 34B may also be required to support dynamic power control and thus requiring the fast-switching APT PMIC 10 to quickly adapt the second APT voltage $V_{CCB}$ in accordance with the second time-variant output power $P_{OUTB}$, as reflected by the second APT target voltage $V_{TGTB}$.

The first voltage circuit 12A may further include a first feedback loop 32A configured to provide a first feedback $V_{CCFBA}$, which can be lower than or equal to the first APT voltage $V_{CCA}$, to the first voltage amplifier 18A and the control circuit 14. The feedback $V_{CCFBA}$ may be utilized by the control circuit 14 to determine the first APT voltage $V_{CCA}$ actually generated by the first voltage circuit 12A at the first voltage output 16A.

The second voltage circuit 12B may also include a second feedback loop 32B configured to provide a second feedback $V_{CCFBB}$, which can be lower than or equal to the second APT voltage $V_{CCB}$, to the second voltage amplifier 18B and the control circuit 14. The second feedback voltage $V_{CCFBB}$ may be utilized by the control circuit 14 to determine the second APT voltage $V_{CCB}$ actually generated by the second voltage circuit 12B at the second voltage output 16B.

Depending on how rapidly the time-variant output power POUT rises or falls, the first voltage amplifier 18A may have to source or sink a high-frequency current $I_{CCA}$ (e.g., an alternating current) to help keep steady the low-frequency current flowing to the first power amplifier 34A. As such, the first voltage amplifier 18A may be configured to generate a sense current $I_{SenseA}$ that is proportionally related to the high-frequency current $I_{CCA}$. Similarly, the second voltage amplifier 18B may have to source or sink a second high-frequency current $I_{CCB}$ (e.g., an alternating current) to help keep steady the low-frequency current flowing to the second power amplifier 34B. Accordingly, the second voltage amplifier 18B may be configured to generate a second sense current $I_{SenseB}$ that is proportionally related to the second high-frequency current $I_{CCB}$.

The first power amplifier 34A may be configured to provide a first power amplifier feedback $V_{CCFBPAA}$, which indicates the APT voltage $V_{CCA}$ actually received by the first power amplifier 34A, to the control circuit 14. Similarly, the second power amplifier 34B may be configured to provide a second power amplifier feedback $V_{CCFBPAB}$, which indicates the second APT voltage $V_{CCB}$ actually received at the second power amplifier 34B, to the control circuit 14.

Notably, the first power amplifier 34A may be coupled to the first voltage output 16A via a respective conductive trace having an inherent trace inductance. As such, the first APT voltage $V_{CCA}$ received at the first power amplifier 34A may be different from the first APT voltage $V_{CCA}$ at the first voltage output 16A. As such, the first power amplifier feedback $V_{CCFBPAA}$ may provide an indication of the trace inductance associated with the conductive trace that couples the first power amplifier 34A to the first voltage output 16A.

Likewise, the second power amplifier 34B may be coupled to the second voltage output 16B via a respective conductive trace having an inherent trace inductance. As such, the second APT voltage $V_{CCB}$ received at the second power amplifier 34B may be different from the second APT voltage $V_{CCB}$ at the second voltage output 16B. As such, the second power amplifier feedback $V_{CCFBPAB}$ may provide an indication of the trace inductance associated with the conductive trace that couples the second power amplifier 34B to the second voltage output 16B.

In addition, the control circuit 14 may also receive a first offset reference voltage $V_{OFFREFA}$ and a second offset reference voltage $V_{OFFREFB}$, which may be preconfigured (e.g., stored) in a register(s) (not shown) in the control circuit 14. As discussed below, the control circuit 14 can be configured to control the switcher circuit 22, the first hybrid circuit 30A, and the second hybrid circuit 30B based on any combination of the first APT target voltage $V_{TGTA}$, the first feedback $V_{CCFBA}$, the first feedback current $I_{SenseA}$, the first power amplifier feedback $V_{CCFBPAA}$, the first offset reference voltage $V_{OFFREFA}$, the second APT target voltage $V_{TGTAB}$, the second feedback voltage $V_{CCFBB}$, the second feedback current $I_{SenseB}$, the second power amplifier feedback $V_{CCFBPAB}$, and the second offset reference voltage $V_{OFFREFB}$.

Figure 3:
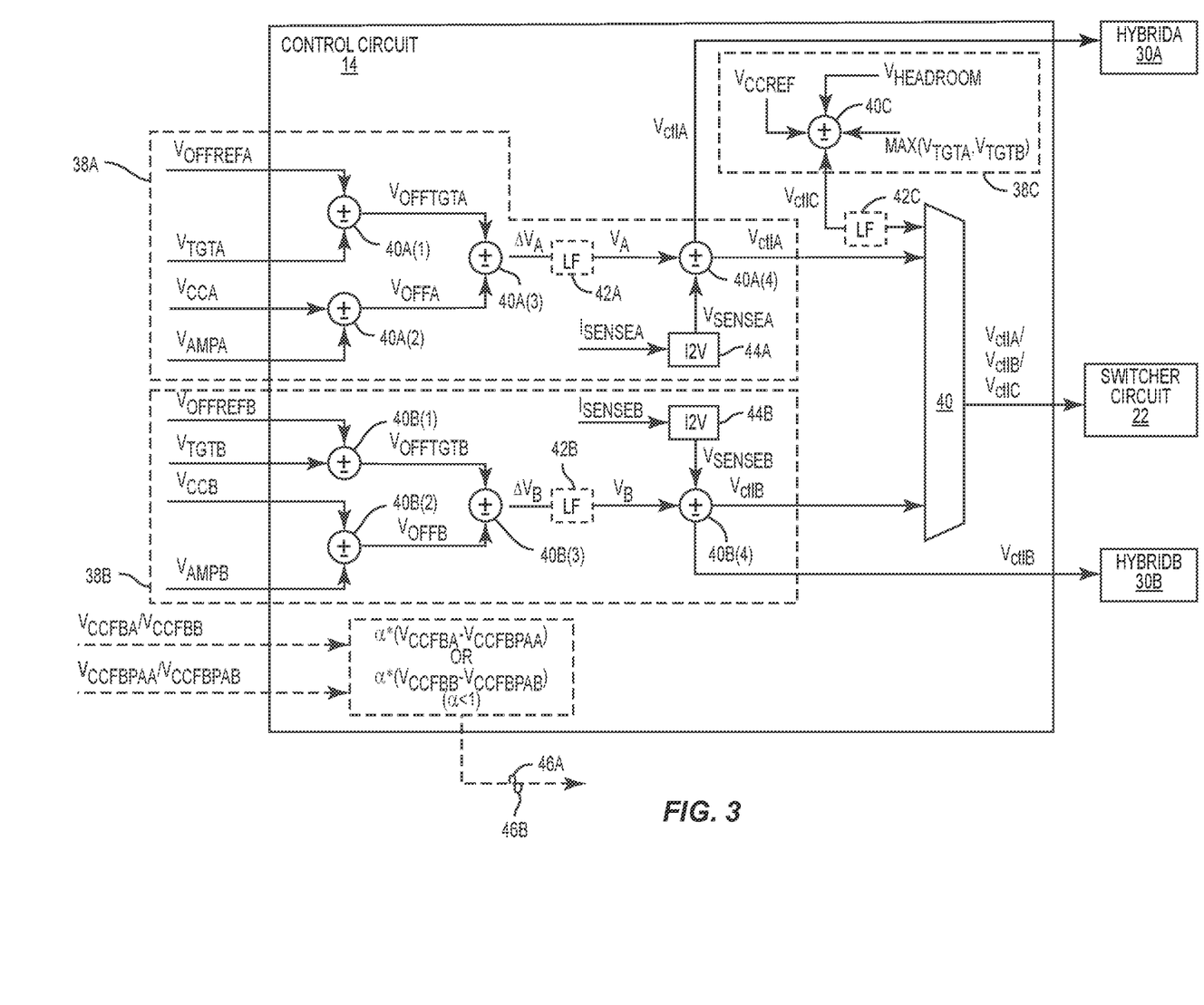
FIG. 3 is a schematic diagram of an exemplary control circuit that can be provided in the fast-switching APT PMIC of FIG. 1.

In this regard, FIG. 3 is a schematic diagram providing an exemplary illustration of the control circuit 14 in the fast-switching APT PMIC 10 of FIG. 1 to cause the first APT voltage $V_{CCA}$ and/or the second APT voltage $V_{CCB}$ to be adapted from one level to another within the predetermined temporal limit. Common elements between FIGS. 1 and 3 are shown therein with common element numbers and will not be re-described herein.

In a non-limiting example, the control circuit 14 includes a first control branch 38A, a second control branch 38B, and a third control branch 38C. The first control branch 38A is configured to generate a first control voltage $V_{CtlA}$ to control the first hybrid circuit 30A. The second control branch 38B is configured to generate a second control voltage $V_{CtlB}$ to control the second hybrid circuit 30B. The third control branch 38C is configured to generate a third control voltage $V_{CtlC}$ based on a headroom voltage $V_{Headroom}$ and a maximum of the first APT target voltage $V_{TGTA}$ and the second APT target voltage $V_{TGTB}$. The control circuit 14 may also include a multiplexer 40 configured to selectively output one of the first control voltage $V_{CtlA}$, the second control voltage $V_{CtlB}$, and the third control voltage $V_{CtlC}$ to control the switcher circuit 22 to adjust the low-frequency voltage $V_{CCREF}$ and thereby the low-frequency current $I_{CCREF}$ at the reference output 24.

More specifically, the first control branch 38A includes a number of first calculators 40A(1)-40A(4), the second control branch 38B includes a number of second calculators 406(1)-406(4), and the third control branch 38C includes a third calculator 40C. In a non-limiting example, any of the first calculators 40A(1)-40A(4), the second calculators 406(1)-406(4), and the third calculator 40C can be implemented by a programmable logic circuit(s).

The first calculator 40A(1) may be configured to determine the first offset target voltage $V_{OFFTGTA}$ based on the first APT target voltage $V_{TGTA}$ and the first offset reference voltage $V_{OFFREFA}$ ($V_{OFFTGTA}=V_{TGTA}-V_{OFFREFA}$). The first calculator 40A(2) may be configured to determine the first offset voltage $V_{OFFA}$ across the first offset capacitor 20A based on the first initial APT voltage $V_{AMPA}$ and the first APT voltage $V_{CCA}$ at the first voltage output 16A ($V_{OFFA}=V_{CCA}-V_{AMPA}$). The first calculator 40A(3) may be configured to determine a first voltage difference $\Delta V_A$ between the first offset target voltage $V_{OFFTGTA}$ and the first offset voltage $V_{OFFA}$ across the first offset capacitor 20A ($\Delta V_A=V_{OFFTGTA}-V_{OFFA}$). The first calculator 40A(3) is coupled to the first calculator 40A(4) via a first loop filter (LF) 42A. The first LF 42A is configured to apply an integrator and zero transfer function to the first voltage difference $\Delta V_A$ to create a first output correction voltage $V_A$.

The first control branch 38A may include a first current-to-voltage (I2V) conversion circuit 44A configured to convert the first sense current $I_{SenseA}$ into a first sense voltage $V_{senseA}$. The first calculator 40A(4) is configured to adjust the first output correction voltage $V_A$ based on the first sense voltage $V_{senseA}$ to generate the first control voltage $\Delta V_{CtlA}$. The first calculator 40A(4) may control the first hybrid circuit 30A based on the first control voltage $\Delta V_{CtlA}$ and provide the first control voltage $\Delta V_{CtlA}$ to the multiplexer 40.

The second calculator 40B(1) may be configured to determine the second offset target voltage $V_{OFFTGTB}$ based on the second APT target voltage $V_{TGTB}$ and the second offset reference voltage $V_{OFFREFB}$ ($V_{OFFTGTB}=V_{TGTB}-V_{OFFREFB}$). The second calculator 40B(2) may be configured to determine the second offset voltage $V_{OFFB}$ across the second offset capacitor 20B based on the second initial APT voltage $V_{AMPB}$ and the second APT voltage $V_{CCB}$ at the second voltage output 16B ($V_{OFFB}=V_{CCB}-V_{AMPB}$). The second calculator 40B(3) may be configured to determine a second voltage difference $\Delta V_B$ between the second offset target voltage $V_{OFFTGTB}$ and the second offset voltage $V_{OFFB}$ across the second offset capacitor 20B ($\Delta V_B=V_{OFFTGTB}-V_{OFFB}$). The second calculator 40B(3) is coupled to the second calculator 40B(4) via a second LF 42B. The second LF 42B is configured to apply an integrator and zero transfer function to the second voltage difference $\Delta V_B$ to create a second output correction voltage $V_B$.

The second control branch 38B may include a second I2V conversion circuit 44B configured to convert the second sense current $I_{SenseB}$ into a second sense voltage $V_{senseB}$. The second calculator 40B(4) is configured to adjust the second output correction voltage $V_B$ based on the second sense voltage $V_{senseB}$ to generate the second control voltage $\Delta V_{CtlB}$. The second calculator 40B(4) may control the second hybrid circuit 30B based on the second control voltage $\Delta V_{CtlB}$ and provide the second control voltage $\Delta V_{CtlB}$ to the multiplexer 40.

The third calculator 40C may be configured to determine the third control voltage $V_{CtlC}$ based on the headroom voltage $V_{Headroom}$ and the maximum of the first APT target voltage $V_{TGTA}$ and the second APT target voltage $V_{TGTB}$. The third calculator 40C may be configured to determine the third control voltage $V_{CtlC}$ further based on the low-frequency voltage $V_{CCREF}$ at the reference output 24. The third calculator 40C is further configured to provide the third control voltage $V_{CtlC}$ to the multiplexer 40. As discussed in detail below, the multiplexer 40 is configured to selectively output one of the first control voltage $V_{CtlA}$, the second control voltage $V_{CtlB}$, and the third control voltage $V_{CtlC}$ to thereby control the switcher circuit 22 under various operating scenarios. The third calculator 40C may be coupled to the multiplexer 40 via a third LF 42C, which applies an integral and zero transfer function to the third control voltage $V_{CtlC}$.

In one example, the first power amplifier 34A is active and the second power amplifier 34B is inactive. As such, the fast-switching APT PMIC 10 is only required to output the first APT voltage $V_{CCA}$ via the first voltage output 16A. In this regard, the control circuit 14 is configured to determine the first offset target voltage $V_{OFFTGTA}$ based on the first APT target voltage $V_{TGTA}$ and adjust the first offset voltage $V_{OFFA}$ based on the first offset target voltage $V_{OFFTGTA}$ to thereby cause the first APT voltage $V_{CCA}$ to become substantially equal to the first APT target voltage $V_{TGTA}$ within the predetermined temporal limit.

Inside the control circuit 14, the first control branch 38A is activated, while the second control branch 38B and the third control branch 38C are deactivated. Accordingly, the first control branch 38A is configured to generate the first control voltage $V_{CtlA}$ as described above to thereby cause the first hybrid circuit 30A to operate in the switch mode to pass the low-frequency current $I_{CCREF}$ directly from the reference output 24 to the first offset capacitor 20A and the first voltage output 16A. The multiplexer 40 is configured to output the first control voltage $V_{CtlA}$ to cause the switcher circuit 22 to adjust the low-frequency current $I_{CCREF}$ to thereby adjust the first offset voltage $V_{OFFA}$ across the first offset capacitor 20A.

In another example, the first power amplifier 34A is inactive and the second power amplifier 34B is active. As such, the fast-switching APT PMIC 10 is only required to output the second APT voltage $V_{CCB}$ via the second voltage output 16B. In this regard, the control circuit 14 is configured to determine the second offset target voltage $V_{OFFTGTB}$ based on the second APT target voltage $V_{TGTB}$ and adjust the second offset voltage $V_{OFFB}$ based on the second offset target voltage $V_{OFFTGTB}$ to thereby cause the second APT voltage $V_{CCB}$ to become substantially equal to the second APT target voltage $V_{TGTB}$ within the predetermined temporal limit.

Inside the control circuit 14, the second control branch 38B is activated, while the first control branch 38A and the third control branch 38C are deactivated. Accordingly, the second control branch 38B is configured to generate the second control voltage $V_{CtlB}$ as described above to thereby cause the second hybrid circuit 30B to operate in the switch mode to pass the low-frequency current $I_{CCREF}$ directly from the reference output 24 to the second offset capacitor 20B and the second voltage output 16B. The multiplexer 40 is configured to output the second control voltage $V_{CtlB}$ to cause the switcher circuit 22 to adjust the low-frequency current $I_{CCREF}$ to thereby adjust the second offset voltage $V_{OFFB}$ across the second offset capacitor 20B.

In another example, the first power amplifier 34A and the second power amplifier 34B are both active. As such, the fast-switching APT PMIC 10 is only required to output the first APT voltage $V_{CCA}$ via the first voltage output 16A and the second APT voltage $V_{CCB}$ via the second voltage output 16B. In this regard, the control circuit 14 is configured to determine the first offset target voltage $V_{OFFTGTA}$ based on the first APT target voltage $V_{TGTA}$ and adjust the first offset voltage $V_{OFFA}$ based on the first offset target voltage $V_{OFFTGTA}$ to thereby cause the first APT voltage $V_{CCA}$ to become substantially equal to the first APT target voltage $V_{TGTA}$ within the predetermined temporal limit. In addition, the control circuit 14 is configured to determine the second offset target voltage $V_{OFFTGTB}$ based on the second APT target voltage $V_{TGTB}$ and adjust the second offset voltage $V_{OFFB}$ based on the second offset target voltage $V_{OFFTGTB}$ to thereby cause the second APT voltage $V_{CCB}$ to become substantially equal to the second APT target voltage $V_{TGTB}$ within the predetermined temporal limit.

In a non-limiting example, the first APT voltage $V_{CCA}$ is higher than the second APT voltage $V_{CCB}$ ($V_{CCA} > V_{CCB}$). In this regard, inside the control circuit 14, the first control branch 38A, the second control branch 38B, and the third control branch 38C are all activated.

Given that the third calculator 40C takes the maximum of the first APT target voltage $V_{TGTA}$ and the second APT target voltage $V_{TGTB}$ as one of the inputs for determining the third control voltage $V_{CtlC}$, the third control voltage $V_{CtlC}$ will represent the first APT voltage $V_{CCA}$ instead of the second APT voltage $V_{CCB}$. The multiplexer 40 will be configured to output the third control voltage $V_{CtlC}$ to the switcher circuit 22 to thereby adjust the low-frequency current $I_{CCREF}$ in accordance with the demand of the first voltage amplifier 18A, the first offset capacitor 20A, and the first power amplifier 34A. As such, the first control branch 38A is configured to generate the first control voltage $V_{CtlA}$ as described above to thereby cause the first hybrid circuit 30A to operate in the switch mode to pass the low-frequency current $I_{CCREF}$ directly from the reference output 24 to the first offset capacitor 20A and the first voltage output 16A.

However, the low-frequency current $I_{CCREF}$ may be higher than what is needed by the second voltage amplifier 18B, the second offset capacitor 20B, and the second power amplifier 34B. As such, the second control branch 38B is configured to generate the second control voltage $V_{CtlB}$ as described above to thereby cause the second hybrid circuit 30B to operate in the current regulator mode to regulate the low-frequency current $I_{CCREF}$ that flows from the reference output 24 to the second offset capacitor 20B and the second voltage output 16B.

In another non-limiting example, the second APT voltage $V_{CCB}$ is higher than the first APT voltage $V_{CCA}$ ($V_{CCB} > V_{CCA}$). In this regard, inside the control circuit 14, the first control branch 38A, the second control branch 38B, and the third control branch 38C are all activated.

Given that the third calculator 40C takes the maximum of the first APT target voltage $V_{TGTA}$ and the second APT target voltage $V_{TGTB}$ as one of the inputs for determining the third control voltage $V_{CtlC}$, the third control voltage $V_{CtlC}$ will represent the second APT voltage $V_{CCB}$ instead of the first APT voltage $V_{CCA}$. The multiplexer 40 will be configured to output the third control voltage $V_{CtlC}$ to the switcher circuit 22 to thereby adjust the low-frequency current $I_{CCREF}$ in accordance with the demand of the second voltage amplifier 18B, the second offset capacitor 20B, and the second power amplifier 34B. As such, the second control branch 38B is configured to generate the second control voltage $V_{CtlB}$ as described above to thereby cause the second hybrid circuit 30B to operate in the switch mode to pass the low-frequency current $I_{CCREF}$ directly from the reference output 24 to the second offset capacitor 20B and the second voltage output 16B.

However, the low-frequency current $I_{CCREF}$ may be higher than what is needed by the first voltage amplifier 18A, the first offset capacitor 20A, and the first power amplifier 34A. As such, the first control branch 38A is configured to generate the first control voltage $V_{CtlA}$ as described above to thereby cause the first hybrid circuit 30A to operate in the current regulator mode to regulate the low-frequency current $I_{CCREF}$ that flows from the reference output 24 to the first offset capacitor 20A and the first voltage output 16A.

In another non-limiting example, the first APT voltage $V_{CCA}$ is equal to the second APT voltage $V_{CCB}$ ($V_{CCA}=V_{CCB}$). In this regard, inside the control circuit 14, the first control branch 38A, the second control branch 38B, and the third control branch 38C are all activated.

Given that the third calculator 40C takes the maximum of the first APT target voltage $V_{TGTA}$ and the second APT target voltage $V_{TGTB}$ as one of the inputs for determining the third control voltage $V_{CtlC}$, the third control voltage $V_{CtlC}$ will be indifferent to the first APT voltage $V_{CCA}$ and the second APT voltage $V_{CCB}$. The multiplexer 40 will be configured to output the third control voltage $V_{CtlC}$ to the switcher circuit 22 to thereby adjust the low-frequency current $I_{CCREF}$.

Accordingly, the first control branch 38A is configured to generate the first control voltage $V_{CtlA}$ as described above to thereby cause the first hybrid circuit 30A to operate in the current regulator mode to regulate the low-frequency current $I_{CCREF}$ that flows from the reference output 24 to the first offset capacitor 20A and the first voltage output 16A. Likewise, the second control branch 38B is configured to generate the second control voltage $V_{CtlB}$ as described above to thereby cause the second hybrid circuit 30B to operate in the current regulator mode to regulate the low-frequency current $I_{CCREF}$ that flows from the reference output 24 to the second offset capacitor 20B and the second voltage output 16B.

In another non-limiting example, the first APT voltage $V_{CCA}$ is approximately equal to the second APT voltage $V_{CCB}$ ($V_{CCA}=V_{CCB}\pm0.1V$). In this regard, inside the control circuit 14, the first control branch 38A, the second control branch 38B, and the third control branch 38C are all activated. The first control branch 38A will generate the first control voltage $V_{CtlA}$ to cause the first hybrid circuit 30A to operate in the current regulator mode. The second control branch 38B will generate the second control voltage $V_{CtlB}$ to cause the second hybrid circuit 30AB to also operate in the current regulator mode.

The third control branch 38C, however, may be configured to generate the third control voltage $V_{CtrlC}$ based on the first offset target voltage $V_{OFFTGTA}$, the second offset target voltage $V_{OFFTGTB}$, or a maximum of the first offset target voltage $V_{OFFTGTA}$ and the second offset target voltage $V_{OFFTGTB}$, in addition to the headroom voltage $V_{Headroom}$ and the maximum of the first APT target voltage $V_{TGTA}$ and the second APT target voltage $V_{TGTB}$.

As mentioned earlier, the first power amplifier feedback $V_{CCFBPAA}$ may provide an indication of the trace inductance associated with the conductive trace that couples the first power amplifier 34A to the first voltage output 16A. Similarly, the second power amplifier feedback $V_{CCFBPAB}$ may provide an indication of the trace inductance associated with the conductive trace that couples the second power amplifier 34AB to the second voltage output 16B. As such, it may be possible to adjust the first APT target voltage $V_{TGTA}$ to compensate for the trace inductance associated with the conductive trace that couples the first power amplifier 34A to the first voltage output 16A. Likewise, it may also be possible to adjust the second APT target voltage $V_{TGTB}$ to compensate for the trace inductance associated with the conductive trace that couples the second power amplifier 34B to the second voltage output 16B.

In this regard, the control circuit 14 may be configured to generate a first APT target adjustment signal 46A based on the first feedback $V_{CCFBA}$ and the first power amplifier feedback $V_{CCFBPAA}$ to adjust the first APT target voltage $V_{TGTA}$. Similarly, the control circuit 14 may be configured to generate a second APT target adjustment signal 46B based on the second feedback $V_{CCFBB}$ and the second power amplifier feedback $V_{CCFBPAB}$ to adjust the second APT target voltage $V_{TGTB}$. In a non-limiting example, the first APT target adjustment signal 46A and the second APT target adjustment signal 46B can be generated based on equations (Eq. 1 and Eq. 2), respectively.

$$\alpha*(V_{CCFBA}-V_{CCFBPAA})\alpha<1 \qquad \text{(Eq. 1)}$$

$$\alpha*(V_{CCFBB}-V_{CCFBPAB})\alpha<1 \qquad \text{(Eq. 2)}$$

With reference back to FIG. 1, the fast-switching APT PMIC 10 may include a first impedance circuit 48A coupled to the first voltage output 16A and a second impedance circuit 48B coupled to the second voltage output 16B. The control circuit 14 may control the first impedance circuit 48A based on a first control signal 50A to reduce impedance at the first voltage output 16A. Likewise, the control circuit 14 may control the second impedance circuit 48B based on a second control signal 50B to reduce impedance at the second voltage output 16B.

Figure 4:
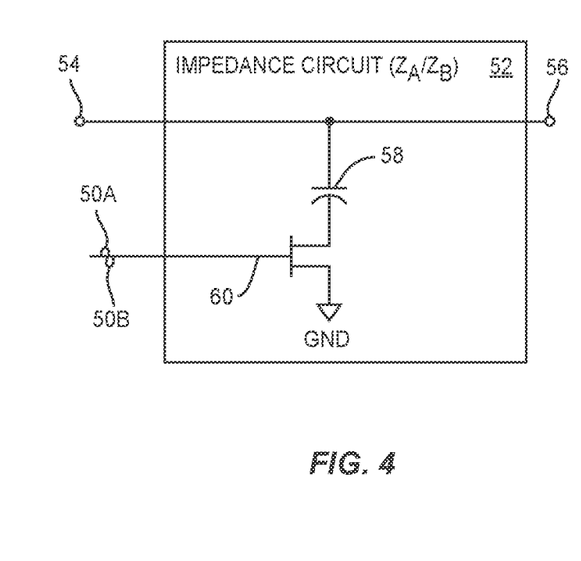
FIG. 4 is a schematic diagram of an exemplary impedance circuit that can be provided in the fast-switching APT PMIC of FIG. 1.

In this regard, FIG. 4 is a schematic diagram of an exemplary impedance circuit 52, which can be provided in the fast-switching APT PMIC 10 of FIG. 1 as any of the first impedance circuit 48A and the second impedance circuit 48B. Common elements between FIGS. 1 and 4 are shown therein with common element numbers and will not be re-described herein.

The impedance circuit 52 includes a first node 54 and a second node 56. The first node 54 may be coupled to any of the first offset capacitor 20A and the second offset capacitor 20B. The second node 56 may be coupled to any of the first voltage output 16A and the second voltage output 16B.

The impedance circuit 52 includes a decoupling capacitor 58 and a pull-down transistor 60, which can be an n-type field-effect transistor (nFET) or a p-type FET (pFET), as an example. The decoupling capacitor 58 may have a capacitance between 10 to 20 nF. When the first APT voltage $V_{CCA}$ or the second APT voltage $V_{CCB}$ is in a transition from high to low, or vice versa, the pull-down transistor 60 may be controlled via the first control signal 50A or the second control signal 50B to disconnect the decoupling capacitor 58 by presenting a high impedance. In contrast, when the first APT voltage $V_{CCA}$ or the second APT voltage $V_{CCB}$ is not in the transition, the pull-down transistor 60 may be slowly pulled down to gradually present a lower impedance. As a result, it may help avoid creating glitches in the first APT voltage $V_{CCA}$ and the second APT voltage $V_{CCB}$.

Those skilled in the art will recognize improvements and modifications to the preferred embodiments of the present disclosure. All such improvements and modifications are considered within the scope of the concepts disclosed herein and the claims that follow.

What is claimed is:

1. A fast-switching average power tracking (APT) power management integrated circuit (PMIC) comprising:
   a first voltage amplifier configured to generate a first initial APT voltage based on a first APT target voltage;
   a first offset capacitor configured to raise the first initial APT voltage by a first offset voltage to generate a first APT voltage at a first voltage output;
   a second voltage amplifier configured to generate a second initial APT voltage based on a second APT target voltage;
   a second offset capacitor configured to raise the second initial APT voltage by a second offset voltage to generate a second APT voltage at a second voltage output; and
   a control circuit configured to:
      determine at least one offset target voltage based on at least one of the first APT target voltage and the second APT target voltage; and
      adjust at least one of the first offset voltage and the second offset voltage based on the at least one offset target voltage to thereby cause at least one of the first APT voltage and the second APT voltage to become substantially equal to the at least one of the first APT target voltage and the second APT target voltage within a predetermined temporal limit.

2. The fast-switching APT PMIC of claim 1 further comprising:
   a switcher circuit comprising a multi-level charge pump (MCP) configured to generate a low-frequency voltage based on a battery voltage to thereby induce a low-frequency current at a reference output;
   a first hybrid circuit coupled to the reference output and configured to:
      operate in a current regulator mode to regulate the low-frequency current that flows from the reference output toward the first voltage output and the first offset capacitor; or
      operate in a switch mode to pass the low-frequency current from the reference output to the first voltage output and the first offset capacitor; and
   a second hybrid circuit coupled to the reference output and configured to:
      operate in the current regulator mode to regulate the low-frequency current that flows from the reference output toward the second voltage output and the second offset capacitor; or
      operate in the switch mode to pass the low-frequency current from the reference output to the second voltage output and the second offset capacitor.

3. The fast-switching APT PMIC of claim 2 further comprising:
   a first impedance circuit coupled to the first voltage output and configured to:
      present a higher impedance at the first voltage output when the first APT voltage is in a transition; and
      present a lower impedance at the first voltage output when the first APT voltage is not in the transition; and
   a second impedance circuit coupled to the second voltage output and configured to:
      present a higher impedance at the second voltage output when the second APT voltage is in a transition; and
      present a lower impedance at the second voltage output when the second APT voltage is not in the transition.

4. The fast-switching APT PMIC of claim 2 wherein the control circuit comprises:
   a first control branch configured to generate a first control voltage to thereby cause the first hybrid circuit to operate in the current regulator mode or the switch mode;
   a second control branch configured to generate a second control voltage to thereby cause the second hybrid circuit to operate in the current regulator mode or the switch mode;
   a third control branch configured to generate a third control voltage based on a headroom voltage and a maximum one of the first APT target voltage and the second APT target voltage; and
   a multiplexer configured to selectively output one of the first control voltage, the second control voltage, and the third control voltage to thereby control the switcher circuit to adjust the low-frequency voltage and the low-frequency current at the reference output.

5. The fast-switching APT PMIC of claim 4 wherein the control circuit is further configured to:
   determine a first offset target voltage based on the first APT target voltage; and
   adjust the first offset voltage based on the first offset target voltage to thereby cause the first APT voltage to become substantially equal to the first APT target voltage within the predetermined temporal limit.

6. The fast-switching APT PMIC of claim 5 wherein:
   the first control branch is further configured to generate the first control voltage based at least on the first offset target voltage to thereby cause the first hybrid circuit to operate in the switch mode; and
   the multiplexer is further configured to output the first control voltage to cause the switcher circuit to adjust the low-frequency current to thereby adjust the first offset voltage across the first offset capacitor.

7. The fast-switching APT PMIC of claim 4 wherein the control circuit is further configured to:
   determine a second offset target voltage based on the second APT target voltage; and
   adjust the second offset voltage based on the second offset target voltage to thereby cause the second APT voltage to become substantially equal to the second APT target voltage within the predetermined temporal limit.

8. The fast-switching APT PMIC of claim 7 wherein:
   the second control branch is further configured to generate the second control voltage based at least on the second offset target voltage to thereby cause the second hybrid circuit to operate in the switch mode; and
   the multiplexer is further configured to output the second control voltage to cause the switcher circuit to adjust the low-frequency current to thereby adjust the second offset voltage across the second offset capacitor.

9. The fast-switching APT PMIC of claim 4 wherein the control circuit is further configured to:
   determine a first offset target voltage based on the first APT target voltage;
   adjust the first offset voltage based on the first offset target voltage to thereby cause the first APT voltage to become substantially equal to the first APT target voltage within the predetermined temporal limit;
   determine a second offset target voltage based on the second APT target voltage; and
   adjust the second offset voltage based on the second offset target voltage to thereby cause the second APT voltage to become substantially equal to the second APT target voltage within the predetermined temporal limit.

10. The fast-switching APT PMIC of claim 9 wherein the first APT voltage is greater than the second APT voltage.

11. The fast-switching APT PMIC of claim 10 wherein:
the first control branch is further configured to generate the first control voltage based at least on the first offset target voltage to thereby cause the first hybrid circuit to operate in the switch mode;
the second control branch is further configured to generate the second control voltage based at least on the second offset target voltage to thereby cause the second hybrid circuit to operate in the current regulator mode;
the third control branch is further configured to generate the third control voltage based on the headroom voltage, the first APT target voltage, and a feedback of the low-frequency voltage at the reference output; and
the multiplexer is further configured to output the third control voltage to cause the switcher circuit to adjust the low-frequency current at the reference output to thereby adjust the first offset voltage across the first offset capacitor and the second offset voltage across the second offset capacitor.

12. The fast-switching APT PMIC of claim 9 wherein the second APT voltage is greater than the first APT voltage.

13. The fast-switching APT PMIC of claim 12 wherein:
the first control branch is further configured to generate the first control voltage based at least on the first offset target voltage to thereby cause the first hybrid circuit to operate in the current regulator mode;
the second control branch is further configured to generate the second control voltage based at least on the second offset target voltage to thereby cause the second hybrid circuit to operate in the switch mode;
the third control branch is further configured to generate the third control voltage based on the headroom voltage, the second APT target voltage, and a feedback of the low-frequency voltage at the reference output; and
the multiplexer is further configured to output the third control voltage to cause the switcher circuit to adjust the low-frequency current at the reference output to thereby adjust the first offset voltage across the first offset capacitor and the second offset voltage across the second offset capacitor.

14. The fast-switching APT PMIC of claim 9 wherein the first APT voltage is equal to the second APT voltage.

15. The fast-switching APT PMIC of claim 14 wherein:
the first control branch is further configured to generate the first control voltage based at least on the first offset target voltage to thereby cause the first hybrid circuit to operate in the current regulator mode;
the second control branch is further configured to generate the second control voltage based at least on the second offset target voltage to thereby cause the second hybrid circuit to operate in the current regulator mode;
the third control branch is further configured to generate the third control voltage based on the headroom voltage, any one of the first APT target voltage and the second APT target voltage, and a feedback of the low-frequency voltage at the reference output; and
the multiplexer is further configured to output the third control voltage to cause the switcher circuit to adjust the low-frequency current at the reference output to thereby adjust the first offset voltage across the first offset capacitor and the second offset voltage across the second offset capacitor.

16. The fast-switching APT PMIC of claim 9 wherein the first APT voltage is approximately equal to the second APT voltage.

17. The fast-switching APT PMIC of claim 16 wherein:
the first control branch is further configured to generate the first control voltage based at least on the first offset target voltage to thereby cause the first hybrid circuit to operate in the current regulator mode;
the second control branch is further configured to generate the second control voltage based at least on the second offset target voltage to thereby cause the second hybrid circuit to operate in the current regulator mode;
the third control branch is further configured to generate the third control voltage based on the headroom voltage, the maximum of the first APT target voltage and the second APT target voltage, and a selected one of the first offset target voltage, the second offset target voltage, and a maximum of the first offset target voltage and the second offset target voltage; and
the multiplexer is further configured to output the third control voltage to cause the switcher circuit to adjust the low-frequency current at the reference output to thereby adjust the first offset voltage across the first offset capacitor and the second offset voltage across the second offset capacitor.

18. The fast-switching APT PMIC of claim 1 wherein:
the first voltage output is coupled to a first power amplifier configured to amplify a first radio frequency (RF) signal based on the first APT voltage; and
the second voltage output is coupled to a second power amplifier configured to amplify a second RF signal based on the second APT voltage.

19. The fast-switching APT PMIC of claim 18 wherein the control circuit is further configured to:
receive a first feedback indicating the first APT voltage at the first voltage output;
receive a second feedback indicating the second APT voltage at the second voltage output;
receive a first power amplifier feedback indicating the first APT voltage at the first power amplifier; and
receive a second power amplifier feedback indicating the second APT voltage at the second power amplifier.

20. The fast-switching APT PMIC of claim 19 wherein the control circuit is further configured to:
adjust the first APT target voltage based on the first feedback and the first power amplifier feedback; and
adjust the second APT target voltage based on the second feedback and the second power amplifier feedback.

* * * * *

UNITED STATES PATENT AND TRADEMARK OFFICE
CERTIFICATE OF CORRECTION

PATENT NO. : 11,558,016 B2
APPLICATION NO. : 17/182539
DATED : January 17, 2023
INVENTOR(S) : Nadim Khlat Page 1 of 1

It is certified that error appears in the above-identified patent and that said Letters Patent is hereby corrected as shown below:

In the Specification

Column 6, Lines 22-23, replace "a time-variant input power PING" with --a time-variant input power $P_{INA}$--.
Column 8, Line 12, replace "406(1)-406(4)" with --40B(1)-40B(4)--.
Column 8, Lines 14-15, replace "the second calculators 406(1)-406(4)" with --the second calculators 40B(1)-40B(4)--.
Column 8, Line 26, replace "a first voltage difference AVA" with --a first voltage difference $\Delta VA$--.
Column 8, Lines 34-35, replace "a first current-to-voltage (12V)" with --a first current-to-voltage (I2V)--.

Signed and Sealed this
Twenty-third Day of July, 2024

Katherine Kelly Vidal
*Director of the United States Patent and Trademark Office*